US007067838B1

(12) United States Patent
Sato et al.

(10) Patent No.: US 7,067,838 B1
(45) Date of Patent: Jun. 27, 2006

(54) GALLIUM-NITRIDE-BASED LIGHT-EMITTING APPARATUS

(75) Inventors: Hisao Sato, Naruto (JP); Naoki Wada, Naruto (JP); Shiro Sakai, Tokushima (JP); Masahiro Kimura, Naruto (JP)

(73) Assignee: Nitride Semiconductors Co., Ltd. (JP)

( * ) Notice: Subject to any disclaimer, the term of this patent is extended or adjusted under 35 U.S.C. 154(b) by 0 days.

(21) Appl. No.: 10/518,148

(22) PCT Filed: Apr. 16, 2004

(86) PCT No.: PCT/JP2004/005475

§ 371 (c)(1), (2), (4) Date: Dec. 17, 2004

(87) PCT Pub. No.: WO2005/101532

PCT Pub. Date: Oct. 27, 2005

(51) Int. Cl.
*H01L 29/06* (2006.01)

(52) U.S. Cl. ........................... 257/17; 257/15; 257/87; 257/103; 438/22

(58) Field of Classification Search ............ 257/10–39, 257/79–103; 438/22–47
See application file for complete search history.

(56) References Cited

U.S. PATENT DOCUMENTS

| | | | | |
|---|---|---|---|---|
| 5,544,188 | A * | 8/1996 | Takiguchi et al. | 372/45.01 |
| 5,959,307 | A * | 9/1999 | Nakamura et al. | 257/14 |
| 6,472,683 | B1 * | 10/2002 | Li | 257/25 |
| 6,738,175 | B1 * | 5/2004 | Morita et al. | 359/248 |
| 6,785,311 | B1 * | 8/2004 | Najda | 372/45.01 |
| 6,870,193 | B1 * | 3/2005 | Takeya et al. | 257/79 |
| 6,940,100 | B1 * | 9/2005 | Tsujimura et al. | 257/98 |
| 2004/0125839 | A1 * | 7/2004 | Lee et al. | 372/45 |

FOREIGN PATENT DOCUMENTS

| | | | |
|---|---|---|---|
| JP | 10-126006 | A | 5/1998 |
| JP | 2000-196194 | A | 7/2000 |
| JP | 2000-232239 | A | 8/2000 |
| JP | 2002-314204 | A | 10/2002 |
| JP | 2003-115642 | A | 4/2003 |
| JP | 2003-273473 | A | 9/2003 |
| JP | 2004-87908 | A | 3/2004 |

OTHER PUBLICATIONS esp@cenet—Document Biblography and Abstract, publication No. JP2002314204, published on Oct. 25, 2002 (1 page).

esp@cenet—Document Biblography and Abstract, publication No. JP2000232239, published on Aug. 22, 2000 (1 page).

(Continued)

*Primary Examiner*—Anh D. Mai
*Assistant Examiner*—Brian E. Kunzer
(74) *Attorney, Agent, or Firm*—Osha Liang LLP

(57) ABSTRACT

A light-emitting apparatus employing a GaN-based semiconductor. The light-emitting apparatus comprises an n-type clad layer (124); an active layer (129) including an n-type first barrier layer (126), well layers (128), and second barrier layers (130); a p-type block layer (132); and a p-type clad layer (134). By setting the band gap energy Egb of the p-type block layer (132), the band gap energy Eg2 of the second barrier layers (130), the band gap energy Eg1 of the first barrier layer (126), and the band gap energy Egc of the n-type and the p-type clad layers such that the relationship Egb>Eg2>Eg1≧Egc is satisfied; the carriers can be efficiently confined; and the intensity of the light emission can be increased.

20 Claims, 10 Drawing Sheets

OTHER PUBLICATIONS esp@cenet—Document Biblography and Abstract, publication No. JP2003115642, published on Apr. 18, 2003 (1 page).

esp@cenet—Document Biblography and Abstract, publication No. JP10126006, published on May. 15, 1998 (1 page).

esp@cenet—Document Biblography and Abstract, publication No. JP2000196194, published on Jul. 14, 2000 (1 page).

esp@cenet—Document Biblography and Abstract, publication No. JP2004087908, published on Mar. 18, 2004 (1 page).

esp@cenet—Document Biblography and Abstract, publication No. JP2003273473, published on Sep. 26, 2003 (1 page).

* cited by examiner

Prior Art

Prior Art

GALLIUM-NITRIDE-BASED LIGHT-EMITTING APPARATUS

TECHNICAL FIELD

The present invention relates generally to a gallium-nitride-based light-emitting apparatus, and, more particularly, to a light-emitting apparatus such as a light-emitting diode (LED), a semiconductor laser diode (LD), etc., that emits light having a wavelength in the short wave region of 380 nm or less.

BACKGROUND ART

Conventionally, light emitting apparatuses such as LEDs, LDs, etc. are known that employ gallium-nitride (GaN)-based compound semiconductor. As to the emission of light and oscillation having a wavelength in a wavelength region of 380 nm or below, the light emission wavelength of the emission of light and the oscillation is varied by varying the composition ratio of "In" in a GaN-based compound semiconductor including In in constituting an active layer and, more specifically, the wavelength is shortened by reducing the composition ratio of In.

FIGS. 9A, 9B, 10A and 10B show the construction of a light-emitting apparatus (semiconductor laser) described in the patent literature listed below. In FIGS. 9A and 9B, FIG. 9A shows a cross-sectional view of the construction of the light-emitting apparatus and FIG. 9B shows the composition ratio of Al in this cross-sectional construction. This light-emitting apparatus has the construction formed by stacking a first-conducting-type layer 11, an active layer 12, and a second-conducting-type layer 13 on a substrate 21 and a buffer layer 22.

The first-conducting-type layer 11 comprises a contact layer 23, a clad layer 25, and a fist light-guiding layer 26. The active layer 12 comprises an active layer 27. The second-conducting-type layer 13 comprises a carrier-confining layer 28, a second light-guiding layer 29, a clad layer 30, and a contact layer 31. The first and second light-guiding layers 26 and 29 sandwich the active layer 12 (or the actively layer 27) in this construction and the first and second light-guiding layers and the active layer therebetween form a light-guiding path.

FIGS. 10A and 10B show the layer structure in the vicinity of the active layer 12 (or the active layer 27) and the band gaps of the layer structure. The active layer 12 (27) has a construction formed by alternately stacking a plurality of well layers 1*a* and 1*b* and a plurality of barrier layers 2*a*, 2*b* and 2*c*, and the carrier-confining layer 28 is further formed in the active layer 27 or in the vicinity of the active layer. The carrier-confining layer 28 confines carriers from the first-conducting-type layer in the active layer or the well layers. In a device for which it is assumed that the first-conducting-type layer is n-type and the second-conducting-type layer is p-type, the carrier-confining layer 28 confines electrons into the active layer. Additionally, there is description that the carrier-confining layer 28 is provided on the p-type layer side because electrons tend to overflow the active layer more easily than holes, because the diffusion length of electrons is longer compared to the diffusion length of holes in a nitride semiconductor.

There is also description that, when a carrier-confining layer is provided on the n-type layer side, it is not necessary to provide a large offset between the active layer and the barrier layer like the carrier-confining layer on the p-type layer side, and the barrier layer 2*a* arranged most closely to the n-type side in the active layer can be caused to functioned as a hole-confining layer, and that the carrier-confining function of the n-type-side barrier layer 2*a* can be preferably drawn out by increasing the film thickness of the barrier layer 2*a* compared to the other barrier layers (see, e.g., Japanese Patent Application Laid-Open Publication No. 2003-115642).

DISCLOSURE OF THE INVENTION

As described above, a recombination of carriers can be facilitated by taking a multi-quantum well (MQW) structure having an active layer constructed by barrier layers and well layers, and arranging a carrier-confining layer for confining electrons into the p-type layer side and another carrier-confining layer for confining holes to the n-type layer side. However, use of a light-emitting apparatus employing a GaN-based compound semiconductor is expanding increasingly in recent years, such that further improvement of the intensity of the light emission thereof is especially desired.

The object of the present invention is to provide a light-emitting apparatus having a higher intensity of light emission and employing a GaN-based compound semiconductor emitting UV light.

The present invention provides a gallium-nitride-based light-emitting apparatus comprising a substrate; a first-conducting-type clad layer formed on the substrate; an active layer formed on the clad layer; and a second-conducting-type clad layer formed on the active layer, the active layer including barrier layers and well layers made of a gallium-nitride-based compound semiconductor, wherein the barrier layers of the active layer include a first barrier layer formed toward the first-conducting-type clad layer and second barrier layers sandwiched by the well layers, wherein the light-emitting apparatus comprises a second-conducting-type carrier block layer between the active layer and the second-conducting-type clad layer, and wherein the band gap Egb of the carrier block layer, the band gap Eg2 of the second barrier layer, the band gap Eg1 of the first barrier layer and the band gap Egc of the clad layers satisfy the relationship $Egb>Eg2>Eg1 \geqq Egc$.

In the present invention, carriers from the first-conducting-type layer side are blocked by the carrier block layer as well as carriers from the second-conducting-type layer are blocked by the first barrier layer. By setting the relation of the magnitudes of the band gap energy between the layers as above, carriers can be more efficiently confined and recombination in the active layer can be facilitated. Therefore, the intensity of the light emission can be increased. For example, the first conducting type can be set to be n-type and the second conducting type can be set to be p-type, and the first barrier layer functions as a hole-confining layer and the carrier block layer functions as an electron-confining layer.

According to the present invention, carriers can be efficiently confined and the intensity of the light emission can be improved.

BRIEF DESCRIPTION OF THE DRAWINGS

FIGS. 9A and 9B show the configuration of a conventional apparatus, wherein FIG. 9A shows a cross-sectional view of a light-emitting apparatus and FIG. 9B shows the composition ratio of Al; and FIGS. 10A and 10B are illustrative diagrams showing the magnitude of the band gap energy in a conventional apparatus, wherein FIG. 10A shows a layered structure of the apparatus and FIG. 10B shows the magnitude of the band gap energy in the layered structure of FIG. 10A.

BEST MODE FOR CARRYING OUT THE INVENTION

An embodiment of the present invention will now be described with reference to the accompanying drawings.

Figure 1:
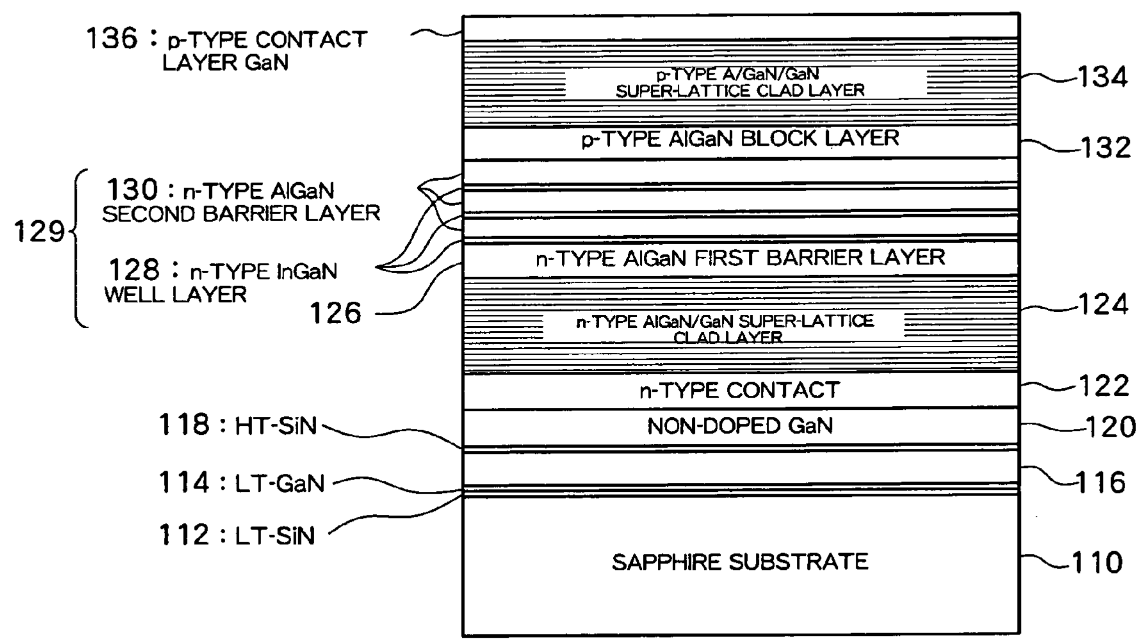
FIG. 1 shows the a light-emitting apparatus according to an embodiment of the present invention.

FIG. 1 shows a cross-sectional view of the construction of a light-emitting apparatus employing a GaN-based compound semiconductor apparatus according to the embodiment.

The light-emitting apparatus has a configuration comprising a substratum layer fabricated by forming one after another a low-temperature (LT) SiN buffer layer 112, a low-temperature (LT) GaN buffer layer 114, a non-doped GaN buffer layer 116, a high-temperature SiN buffer layer 118, non-doped GaN buffer layer 120 on a sapphire substrate 110; an n-type contact layer 122; an active layer including an n-type super-lattice clad layer 124 and an n-type first barrier layer 126; a p-type block layer 132; a p-type super-lattice clad layer 134; and a p-type contact layer 136 that are stacked on the substratum layer. In this configuration, no light-guiding layer is especially set. However, when a light guiding layer is inserted, an n-type-side light-guiding layer may be inserted between the n-type super-lattice clad layer 124 and then-type first barrier layer 126, and a p-type-side light-guiding layer may be inserted between the p-type block layer 132 and the p-type super-lattice clad layer 134.

In addition to the n-type first barrier layer 126, the active layer 129 includes a multi-quantum well (MQW) structure fabricated by stacking alternately n-type well layers 128 and n-type second barrier layers 130. The n-type first barrier layer 126 and the p-type block layer 132 respectively function as carrier-confining layers. That is, the n-type first barrier layer 126 has a function to confine holes from the p-type layers and the p-type block layer 132 has a function to confine electrons from the n-type layers.

The material and the thickness of each of the layers are as follows:

The n-type contact layer 122: Si-doped GaN (2 μm);

The n-type super-lattice clad layer 124: $Al_{0.2}Ga_{0.8}N$ barrier layer (2 nm)/50 GaN well layers (2 nm);

The n-type first barrier layer 126: $Al_{0.13}Ga_{0.87}N$ (26 nm)

The active layer 129: $In_{0.05}Ga_{0.95}N$ well layer 128 (2 nm)/three (3) $Al_{0.19}Ga_{0.81}N$ second barrier layers 130 (13 nm);

The p-type block layer 132: Mg-doped $Al_{0.27}Ga_{0.73}N$ (25 nm);

The p-type super-lattice clad layer 134: Mg-doped $Al_{0.2}Ga_{0.8}N$ barrier layer (2 nm)/30 Mg-doped GaN well layers (2 nm); and The p-type contact layer 136: Mg-doped GaN (20 nm).

Not shown in FIG. 1, these layers function as a light-emitting apparatus by forming an n-type electrode on the n-type contact layer 122 and a p-type electrode on the p-type contact layer 136. The low-temperature SiN buffer layer 112 and the high-temperature buffer layer 118 are not essential and do not need to be formed.

The light-emitting apparatus shown in FIG. 1 is fabricated in a process as follows:

(1) A sapphire C-face substrate wafer 110 is mounted on a susceptor in a MOCVD apparatus and the substrate 110 is heat-treated at 1150° C. in a hydrogen atmosphere for ten (10) minutes.

(2) Next, the temperature is decreased to 500° C., ammonia gas, and silane gas are fed into the apparatus as material gases and the low-temperature SiN buffer layer 112 is grown.

(3) Then, trimethyl-gallium (TMG), and ammonia gas are supplied to the apparatus as material gases and the low-temperature GaN buffer layer 114 is grown.

(4) Next, the temperature is increased to 1075° C., trimethyl-gallium (TMG), and ammonia gas are fed into the apparatus as material gases and the non-doped n-type GaN buffer layer 116 is grown.

(5) Then, the temperature is maintained at 1075° C., ammonia gas, and silane gas are fed into the apparatus as material gases and the high-temperature SiN buffer layer 118 is grown thin.

(6) Next, the temperature is maintained at 1075° C., trimethyl-gallium (TMG) and ammonia gas are fed into the apparatus as material gases and the non-doped n-type GaN layer 120 is grown. A buffer layer as the substratum layer is formed by the above process.

(7) Then, gas containing silicon is supplied at 1075° C. and the Si-doped n-type GaN contact layer 122 is grown.

(8) Next, trimethyl-aluminum (TMA), trimethyl-gallium, ammonia gas, and silane gas are supplied as material gases, and the n-type super-lattice clad layer 124 is grown by growing alternately the n-type AlGaN barrier layers and the n-type GaN well layers for a total of 50 layers.

(9) Then, the temperature is decreased to 850° C.; TMG, TMA, and ammonia gas are supplied as material gases; and the n-type AlGaN first barrier layer 126 is grown.

(10) Next, at 850° C., the active layer 129 is grown by growing alternately the n-type InGaN well layers 128 and the n-type AlGaN second barrier layers 130 for a total of three layers.

(11) Then, the temperature is increased to 1025° C. and the Mg-doped p-type AlGaN block layer 132 is grown.

(12) Next, also at 1025° C., the p-type super-lattice clad layer 134 is grown by growing alternately the Mg-doped p-type AlGaN barrier layers and the Mg-doped p-type GaN well layers for a total of 30 layers.

(13) Finally, at 1025° C., the Mg-doped p-type GaN contact layer 136 is grown.

After forming the layered structure as described above, the wafer is removed from the MOCVD apparatus and the electrodes are formed. More specifically, Ni (10 nm) and Au (10 nm) are vacuum-deposited one after another on the surface of the wafer and is heat-treated at 520° C. in an oxygen atmosphere containing 5% of oxygen and a p-type transparent electrode is formed. Next, photo-resist is applied all over the surface of the wafer and the wafer is etched using the photo-resist as an etching mask until a portion of the n-type contact layer 122 is exposed in the surface. Then, an n-type electrode is formed on the exposed n-type contact layer 122. More specifically, Ti (5 nm) and Al (5 nm) are vacuum-deposited one after another on the wafer, the wafer is heat-treated at 450° C. in nitrogen gas for 30 minutes and the n-type electrode is formed. Gold pads for wire bonding are formed on portions of the p-type transparent electrode and the n-type electrode, the back face of the substrate is polished and a LED chip is cut out by scribing, the chip is mounted in a package and an LED is obtained.

The material and thickness of each of the layers described above are examples and, more specifically, the LED can be fabricated under the conditions as follows:

TABLE 1

| Name of Layer | | Composition | Film Thickness | Carrier Concentration [$cm^{-3}$] | Temp. for Growth |
|---|---|---|---|---|---|
| p-type contact layer | | Al ≦ 0.1, In ≦ 0.1 | ≦35 nm | up to 1E18 | 975 to 1025° C. |
| p-type clad layer, SL barrier layer, | | Al ≦ 0.2, In ≦ 0.1 | ≦2 nm ≦2 nm | up to 5E17 | |
| SL well layer | | Al ≦ 0.05, In ≦ 0.1 | ≦60 layers | | |
| p-type block layer | | Al ≦ 0.1, In ≦ 0.1 | | | |
| Active layer <5 MQ | Non-doped n-type second barrier layer | Al ≦ 0.3, In ≦ 0.05 | ≦20 nm ≦4 nm ≦5 (five) layers | | 800 to 900° C. |
| | Non-doped n-type second well layer | Al ≦ 0.01, In ≦ 0.1 | | | |
| | Non-doped n-type first barrier layer | Al ≦ 0.3, In ≦ 0.05 | ≦50 nm | | |
| n-type clad layer SL barrier layer | | Al ≦ 0.2, In ≦ 0.1 | ≦2 nm | <1E17 to 1E19 | 1050 to 1100° C. |
| SL well layer | | Al ≦ 0.05, In ≦ 0.1 | ≦2 nm ≦60 layers | <1E18 to 1E19 | |
| | n-type contact layer | Al ≦ 0.1, In ≦ 0.1 | ≦3 μm | up to 5E18 | |
| High-temperature buffer | Non-doped n-type second high-temperature buffer layer | Al ≦ 0.1 | ≦2 μm | <1E17 | |
| | High-temperature SiN buffer layer (not essential) | | ≦200 s | | |
| | Non-doped n-type first high-temperature buffer layer | Al ≦ 0.1 | ≦2 μm | 1E17 | |
| Low-temperature buffer | Low temperature GaN-based buffer layer | Al ≦ 0.1 | ≦50 nm | | 450 to 750° C. |
| | Low temperature SiN buffer layer (not essential) | | ≦200 s | | |
| Sapphire substrate | | | | | |

The n-type first barrier layer 126 can be constructed not only with AlGaN but also with $Al_xIn_yGa_{1-x-y}N$ where the ranges of the composition ratios x and y are $0 \leqq x \leqq 0.3$ and $0 \leqq y \leqq 0.05$. In the table, these conditions are represented as Al≦0.3 and In≦0.05.

The n-type well layer 128 and the n-type second barrier layer 130 of the active layer 129 can also respectively be constructed with $Al_xIn_yGa_{1-x-y}N$ and, for the well layer 128, $0 \leqq x \leqq 0.01$ and $0 \leqq y \leqq 0.1$ and, for the n-type second barrier layer 130, $0 \leqq x \leqq 0.3$ and $0 \leqq y \leqq 0.05$, respectively. In the table, these are represented as Al≦0.01 and In≦0.1 for the n-type well layer 128 and Al≦0.3 and In≦0.05 for the n-type second barrier layer 130. The materials of the n-type first barrier layer 126, the n-type well layer 128, the n-type second barrier layer 130, the p-type block layer 132 and the super-lattice clad layers 124 and 134 are summarized as follows:

The n-type first barrier layer 126 and the n-type second barrier layer 130: $Al_xIn_yGa_{1-x-y}N$ ($0 \leqq x \leqq 0.3$ and $0 \leqq y \leqq 0.05$);

The n-type well layer 128: $Al_aIn_bGa_{1-a-b}N$ ($0 \leqq a \leqq 0.01$ and $0 \leqq b \leqq 0.1$);

The p-type carrier block layer: $Al_pIn_qGa_{1-p-q}N$ ($0 \leqq p \leqq 0.5$ and $0 \leqq q \leqq 0.1$)

The super-lattice clad layer (barrier layer): $Al_\alpha In_\gamma Ga_{1-\alpha-\gamma}N$ ($0 \leqq \alpha \leqq 0.2$ and $0 \leqq \gamma \leqq 0.1$)

The super-lattice clad layer (well layer): $Al_\beta In_\eta Ga_{1-\beta-\eta}N$ ($0 \leqq \beta \leqq 0.05$ and $0 \leqq \eta \leqq 0.1$)

The aspect of the configuration shown in FIG. 1 that differs from the conventional configuration shown in FIGS. 9A, 9B, 10A, and 10B is that the composition ratios of the n-type super lattice clad layer 124, the p-type super-lattice clad layer 134, the p-type block layer 132, then-type second barrier layer 130, and the n-type first barrier layer 126 are controlled and are set such that the band gap energy of these layers satisfy predetermined relationships. More specifically, when the band gap energy of the p-type block layer 132 as Egb, the band gap energy of n-type second barrier layer 130 of the active layer 129 as Eg2, the band gap energy of the n-type first barrier layer 126 as Eg1, and the band gap energy of the of the n-type clad layer 124 and the p-type clad layer 134 as Egc, in the present invention the relationship Egb>Eg2>Eg1≧Egc must be satisfied.

Figure 2:
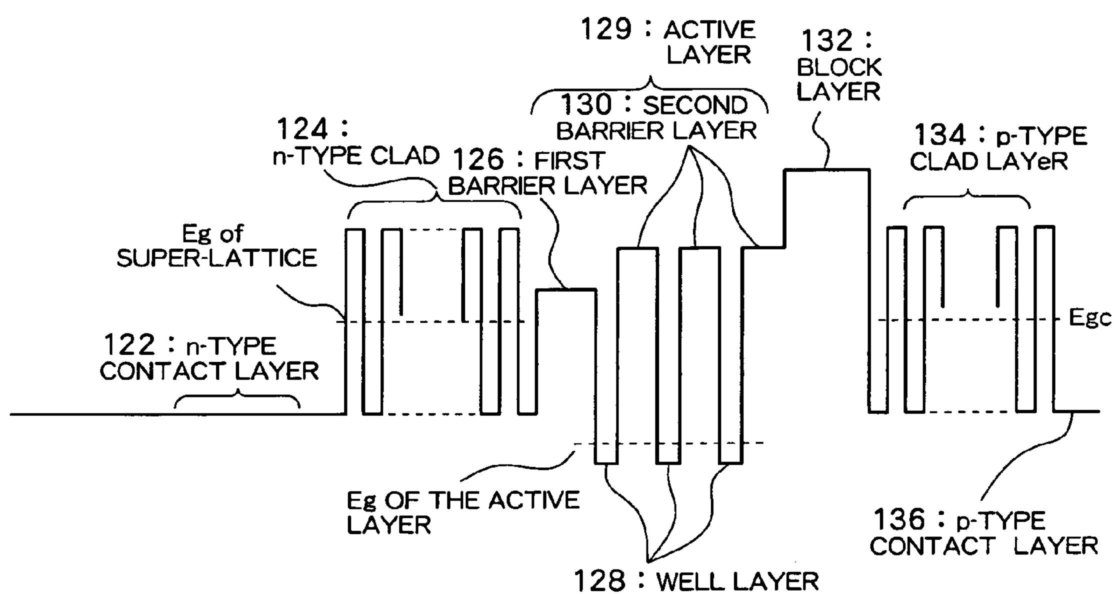
FIG. 2 is an illustrative diagram of the magnitudes of band gaps of the present invention as configured in the embodiment.

FIG. 2 shows the relationships of magnitudes of the band gap energies of each of the layers. The n-type clad layer 124 and the p-type clad layer 134 have a super-lattice structure. Denoting this effective band gap energy as Egc, the band gap Egb of the p-type block layer 132 must be higher than Egc and Eg2 to confine electrons that are the carriers. That is, Egb must be greater than Eg2. As to the relation of magnitudes between Eg1 and Eg2, because it is not necessary to provide a band offset between the active layer and the barrier layer as shown in the patent literature described above, the Eg2 may also be equal to Eg1. However, as described below, the inventor of the present invention found as the result of various experiments that the intensity of the light emission is increased to a greater extent when Eg1<E g2.

Figure 3:
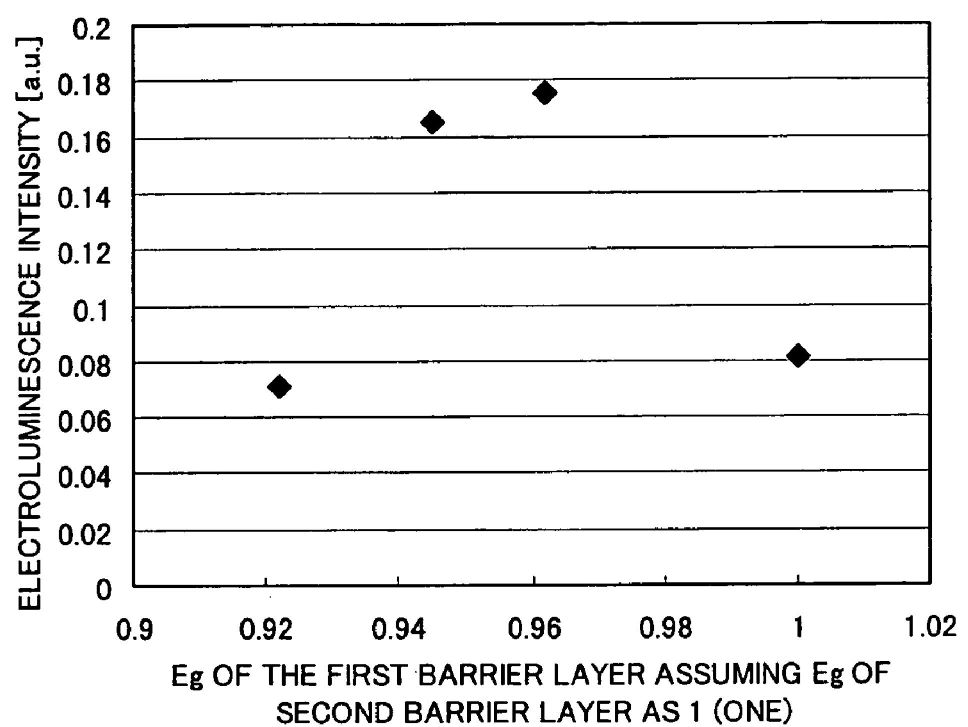
FIG. 3 shows the relationship between intensity of light emission and the ratio of the band gap of a first barrier layer to that of a second barrier layer.

FIG. 3 shows variation of the intensity of light emission in the case where the band gap energy Eg1 of the n-type first barrier layer 126 is varied assuming the value of the band gap energy Eg2 of the n-type second barrier layer 130 is 1 (one). The intensities of light emission are compared using each total light output emitted from the fabricated LED device when a current is injected into the device as measured by placing the device in an integrating sphere. The wavelength of the light emission is approximately 370 nm. In the figure, the axis of the abscissa represents Eg1/Eg2 and the axis of the ordinate represents electroluminescence intensity (relative intensity). Variation of the band gap energy of the n-type first barrier layer 126 is realized by varying the composition ratio of Al in $Al_xGa_{1-x}N$ by varying the amount supplied of trimethyl-aluminum (TMA). The band gap energy is increased as the composition ratio x of Al is increased by increasing the amount of TMA supplied. Band gap energy other than Eg1 such as, for example, Egc and Egb is set at a constant value. As can be seen from the figure, when Eg1 and Eg2 are equal (Eg1/Eg2=1), the intensity of the light emission is 0.08, whereas, when Eg1/Eg2=0.96 meaning that Eg1 is lower than Eg2, the intensity of the light emission is increased to the vicinity of 0.18. From this fact, it can be seen that the intensity of the light emission is increased by setting the relation of energy as Eg2>Eg1.

Figure 4:
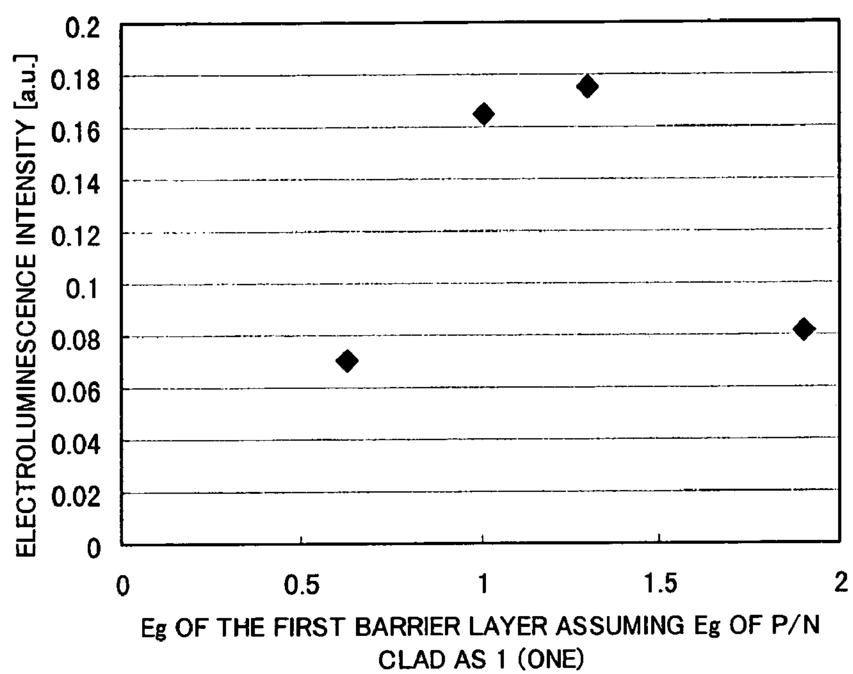
FIG. 4 is an illustrative diagram showing the relationship between intensity of light emission and the ratio of the band gap of the first barrier layer to that of a clad.
Figure 5:
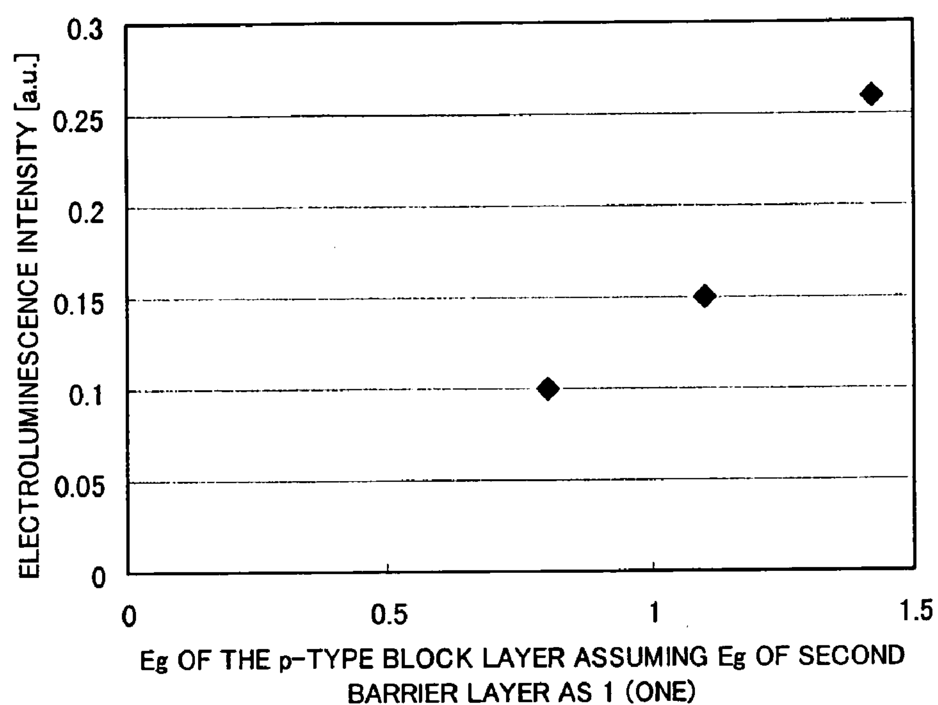
FIG. 5 shows the relationship between intensity of light emission and the ratio of the band gap of a p-type block layer to that of a second barrier layer.

In FIG. 3, when the value of Eg1 is further decreased and Eg1/Eg2=0.92, the intensity of the light emission is decreased to 0.07 because Eg1 is smaller than the effective band gap Egc of the n-type super-lattice clad layer 124 and, as a result, the hole-confining effect is decreased. FIG. 4 shows the variation in the intensity of the light emission when the band gap Eg1 of the n-type first barrier layer 126 is varied, assuming the values of the effective band gap Egc of the n-type clad layer 126 and p-type clad layer 134 are 1 (one). Similarly as in the case shown in FIG. 3, the band gap energy of the n-type first barrier layer 126 is varied by varying the composition ratio x of Al in $Al_xGa_{1-x}N$ constituting the first barrier layer. As can be seen from the figure, compared to the intensity of the light emission of 0.16 when Eg1 and Egc are equal, that is, when Eg1/Egc=1 (one), the intensity of the light emission is increased to 0.18 when Eg1/Egc=1.3 and the intensity of the light emission is decreased to 0.07 when Eg1/Egc=0.6. Therefore, it can be seen that Eg1 must be made greater than Egc to increase the intensity of the light emission.

In FIG. 4, the intensity of the light emission decreases to 0.08 when Eg1 is further increased and Eg1/Egc=1.9 because, when Eg1 is set at a value that is too large, the relationship becomes Eg1>Eg2.

Figure 6:
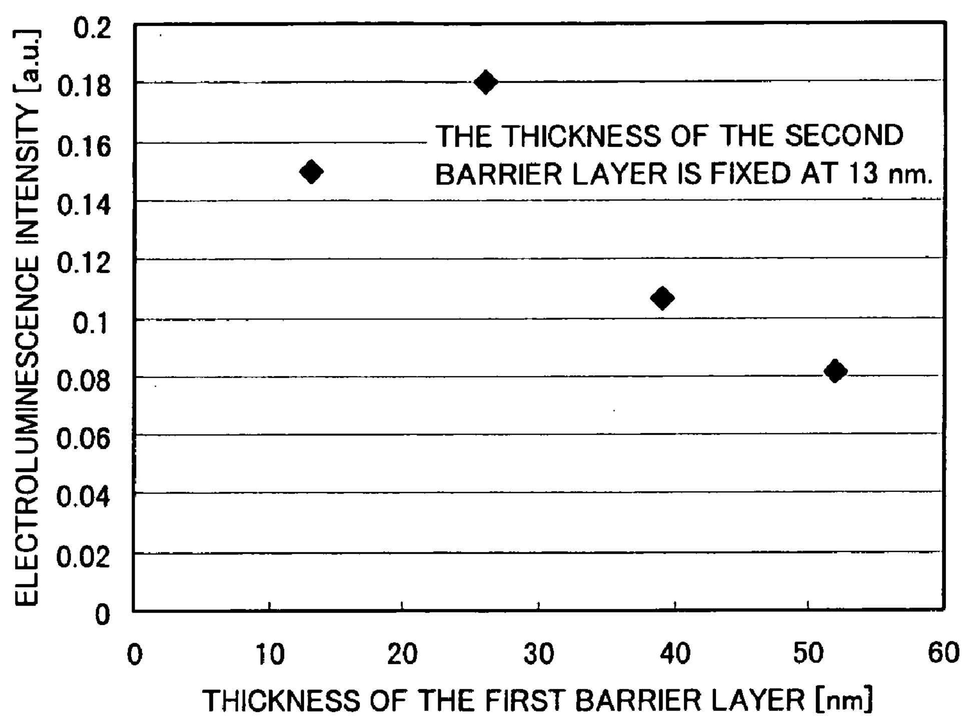
FIG. 6 shows the relationship between the film thickness of the first barrier layer and the intensity of the light emission.

FIG. 6 shows variation of the intensity of the light emission when the band gap energy Egb of the p-type block layer 132 is varied and the value of the band gap energy Eg2 of the n-type second barrier layer 130 is assumed to be 1 (one). The intensity of the light emission is monotonously increased as the band gap energy Egb of the p-type block layer 132 is increased because the electron-confining effect is increased as Egb is increased.

From the above, it can be seen that the intensity of the light emission of the apparatus can be increased to a greater degree than in a conventional apparatus by ensuring that the relationship Egb>Eg2>Eg1≧Egc as shown in FIG. 2 is maintained.

On the other hand, regarding the thickness of the n-type first barrier layer 126, it is described in the above patent literature that the layer 126 is formed with a greater thickness than other barrier layers. However, when the n-type first barrier layer 126 is constructed with non-doped AlGaN or non-doped AlInGaN, the intensity of the light emission is decreased when this layer is formed too thick because this layer also functions as a resistor layer.

FIG. 6 shows variation of the intensity of emitted light when the thickness of the n-type first barrier layer 126 is varied while the thickness of the n-type second barrier layer 130 is fixed. The intensity of the light emission is increased as the thickness of the n-type first barrier layer 126 is increased and an intensity of the light emission of 0.18 is realized when the thickness is in the vicinity of 25 nm. However, when the layer is formed to a greater thickness, the intensity of the light emission begins to decrease. Therefore, denoting the thickness of the n-type first barrier layer 126 as d1 and the thickness of the n-type second barrier layer 130 as d2, it is desirable that the values satisfy the relationship d1>d2. However, it is necessary to suppress the upper limit of d1 to 50 nm or less.

Figure 7:
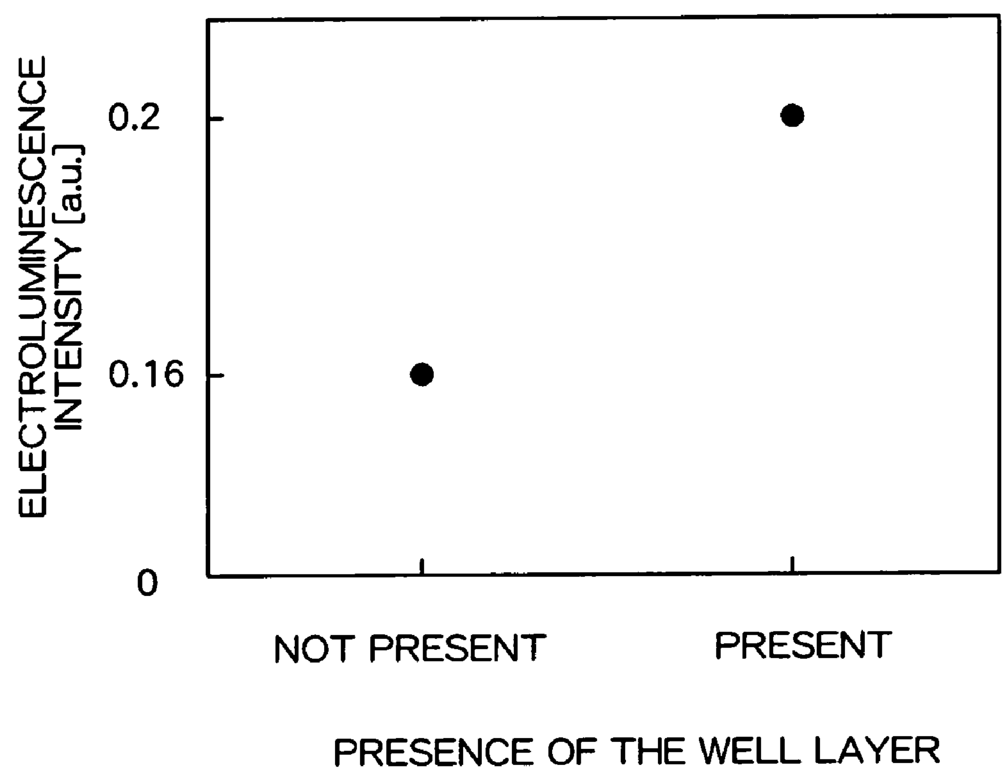
FIG. 7 shows the relationship between the presence or non-presence of a well layer and the intensity of the light emission.

In the embodiment, the n-type well layer 128 and the n-type second barrier layer 130 are stacked on the n-type first barrier layer 126, and the n-type well layer 128 is formed between the n-type first barrier layer 126 and the n-type second barrier layer 130. The presence of this well layer is also preferable from the viewpoint of improving the intensity of the light emission. FIG. 7 shows variation of the intensity of the light emission in cases where the well layer is either formed or not formed between the n-type first barrier layer 126 and the n-type second barrier layer 130. The intensity of the light emission is 0.2 when the well layer is formed, as compared to an intensity of of 0.16 when the well layer is not formed.

Figure 8:
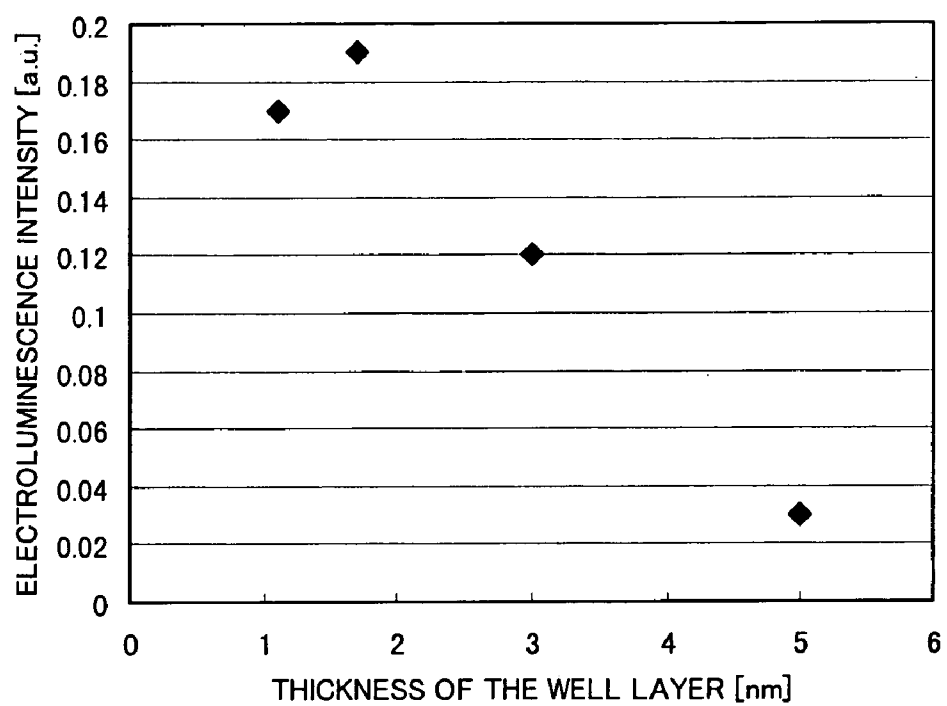
FIG. 8 shows the relationship between the film thickness of a well layer and the intensity of the light emission.
Figure 9A:
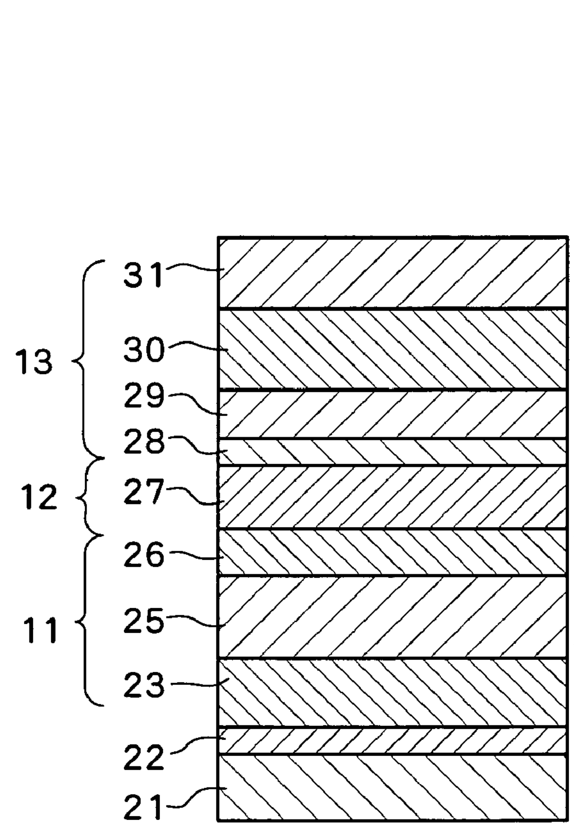
Figure 9B:
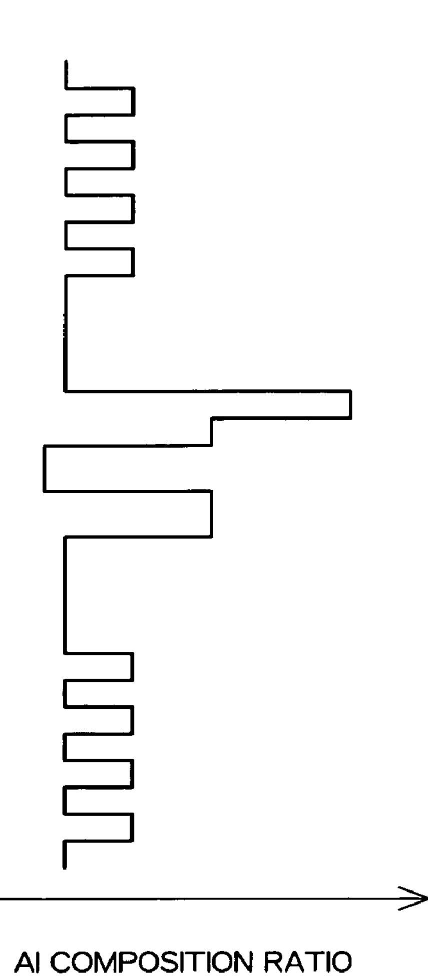
Figure 10A:
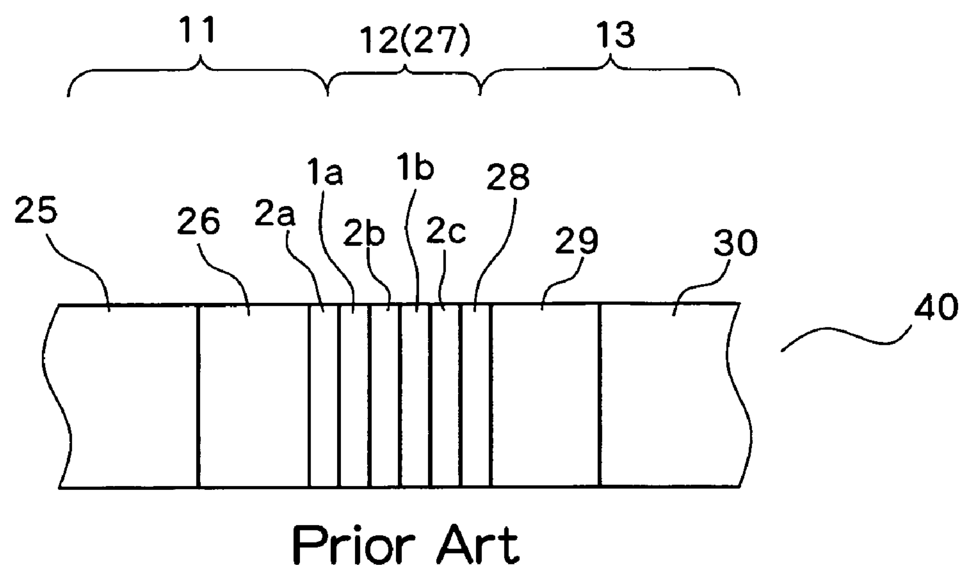
Figure 10B:
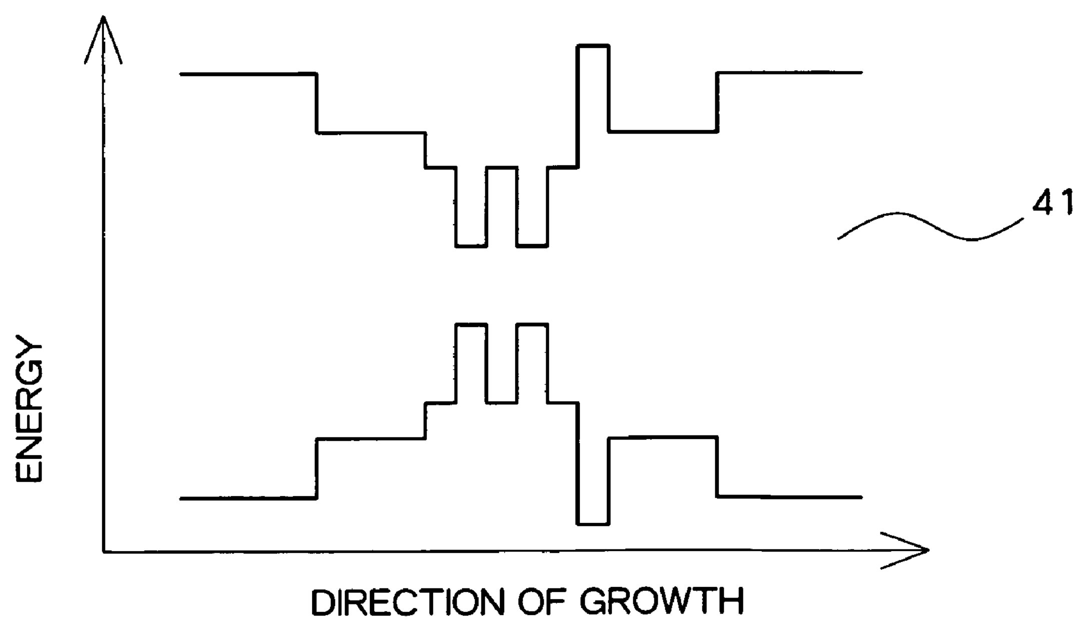

Furthermore, in the embodiment, the active layer 129 is structured by the MQW consisting of the n-type first barrier layer 126, the n-type well layer 128 and the n-type second barrier layer 130. However, it is preferable to cause an increase in the quantum effect by forming the n-type well layer 128 such that the thickness of the layer 128 as thin as possible. FIG. 8 shows variation of the intensity of the light emission in the case where the thickness of the n-type well layer 128 is varied while the thickness of the n-type second barrier layer 130 is fixed. The intensity of the light emission is increased as the n-type well layer 128 becomes thinner. Therefore, the thickness of the well layer 128 may be 5 nm or below, more preferably, 4 nm or less.

The invention claimed is:

1. A gallium-nitride-based light-emitting apparatus comprising:

a substrate;

a first-conducting-type clad layer formed on the substrate;

an active layer formed on the first-conducting-type clad layer; and a second-conducting-type clad layer formed on the active layer, the active layer including barrier layers and well layers made of a gallium-nitride-based compound semiconductor, wherein the barrier layers of the active layer include a first barrier layer formed toward the first-conducting-type clad layer and second barrier layers sandwiched by the well layers, the light-emitting apparatus comprises a second-conducting-type carrier block layer between the active layer and the second-conducting-type clad layer, and the band gap Egb of the second-conducting-type carrier block layer, the band gap Eg2 of the second barrier layers, the band gap Eg1 of the first barrier layer, and the band gap Egc of the clad layers satisfy the relationship Egb>Eg2>Eg1>Egc.

2. A gallium-nitride-based light-emitting apparatus according to claim 1, wherein a thickness d1 of the first barrier layer and a thickness d2 of each of the second barrier layers satisfy the relationship d1>d2.

3. A gallium-nitride-based light-emitting apparatus according to claim 2, wherein the thickness d1 of the first barrier layer satisfies the relationship d1≦50 nm.

4. A gallium-nitride-based light-emitting apparatus according to claim 1, wherein a thickness d3 of each of the well layers satisfies the relationship d3≦4 nm.

5. A gallium-nitride-based light-emitting apparatus according to claim 1, wherein the first barrier layer and the second barrier layers comprise $Al_xIn_yGa_{1-x-y}N$ (0≦x≦0.3 and 0≦y≦0.05), and wherein the well layers comprise $Al_aIn_bGa_{1-a-b}N$ (0≦a≦0.01 and 0≦b≦0.1).

6. A gallium-nitride-based light-emitting apparatus according to claim 1, wherein the second-conducting-type carrier block layer comprises $Al_pIn_qGa_{1-p-q}N$ (0≦p≦0.5 and 0≦q≦0.1).

7. A gallium-nitride-based light-emitting apparatus according to claim 1, wherein the clad layers comprise a super-lattice structure formed by stacking layers of $Al_\alpha In_\gamma Ga_{1-\alpha-\gamma}N$ (0≦α≦0.2 and 0≦γ≦0.1) and layers of $Al_\beta In_\eta Ga_{1-\beta-\eta}N$ (0≦β≦0.05 and 0≦η≦0.1).

8. A gallium-nitride-based light-emitting apparatus according to claim 2, wherein a thickness d3 of each of the well layers satisfies the relationship d3≦4 nm.

9. A gallium-nitride-based light-emitting apparatus according to claim 2, wherein the first barrier layer and the second barrier layers comprise $Al_xIn_yGa_{1-x-y}N$<(0≦x≦0.3 and 0≦y≦0.05), and wherein the well layers comprise $Al_aIn_bGa_{1-a-b}N$ (0≦a≦0.01 and 0≦b≦0.1).

10. A gallium-nitride-based light-emitting apparatus according to claim 3, wherein the first barrier layer and the second barrier layers comprise $Al_xIn_yGa_{1-x-y}N$ (0≦x≦0.3 and 0≦y≦0.05), and wherein the well layers comprise $Al_aIn_bGa_{1-a-b}N$ (0≦a≦0.01 and 0≦b≦0.1).

11. A gallium-nitride-based light-emitting apparatus according to claim 4, wherein the first barrier layer and the second barrier layers comprise $Al_xIn_yGa_{1-x-y}N$ (0≦x≦0.3 and 0≦y≦0.05), and wherein the well layers comprise $Al_aIn_bGa_{1-a-b}N$ (0≦a≦0.01 and 0≦b≦0.1).

12. A gallium-nitride-based light-emitting apparatus according to claim 2, wherein the second-conducting-type carrier block layer comprises $Al_pIn_qGa_{1-p-q}N$ (0≦p≦0.5 and 0≦q≦0.1).

13. A gallium-nitride-based light-emitting apparatus according to claim 3, wherein the second-conducting-type carrier block layer comprises $Al_pIn_qGa_{1-p-q}N$ (0≦p≦0.5 and 0≦q≦0.1).

14. A gallium-nitride-based light-emitting apparatus according to claim 4, wherein the second-conducting-type carrier block layer comprises $Al_pIn_qGa_{1-p-q}N$ (0≦p≦0.5 and 0≦q≦0.1).

15. A gallium-nitride-based light-emitting apparatus according to claim 5, wherein the second-conducting-type carrier block layer comprises $Al_pIn_qGa_{1-p-q}N$ (0≦p≦0.5 and 0≦q≦0.1).

16. A gallium-nitride-based light-emitting apparatus according to claim 2, wherein the clad layers comprise a super-lattice structure formed by stacking layers of $Al_\alpha In_\gamma Ga_{1-\alpha-\gamma}N$ (0≦α≦0.2 and 0≦γ≦0.1) and layers of $Al_{\beta In\eta}Ga_{1-\alpha-\gamma}N$ (0β0.05 and 0≦η≦0.1).

17. A gallium-nitride-based light-emitting apparatus according to claim 3, wherein the clad layers comprise a super-lattice structure formed by stacking layers of $Al_\alpha In_\gamma Ga_{1-\alpha-\gamma}N$ (0≦α≦0.2 and 0≦γ≦0.1) and layers of $Al_{\beta In\eta Ga1-\beta-\eta}N$ (0≦β≦0.05 and 0≦η≦0.1).

18. A gallium-nitride-based light-emitting apparatus according to claim 4, wherein the clad layers comprise a super-lattice structure formed by stacking layers of $Al_\alpha In_\gamma Ga_{1-\alpha-\gamma}N$ (0≦α≦0.2 and 0≦γ≦0.1) and layers of $Al_\beta In_\eta Ga_{1-\beta-\eta}N$ (0≦β≦0.05 and 0≦γ≦0.1).

19. A gallium-nitride-based light-emitting apparatus according to claim 5, wherein the clad layers comprise a super-lattice structure formed by stacking layers of $Al_\alpha In_\beta Ga_{1-\alpha-\gamma}N$ (0≦α≦0.2 and 0≦γ≦0.1) and layers of $Al_\beta In_\eta Ga_{1-\beta-\eta}N$ (0≦β≦0.05 and 0≦η≦0.1).

20. A gallium-nitride-based light-emitting apparatus according to claim 6, wherein the clad layers comprise a super-lattice structure formed by stacking layers of $Al_\alpha In_\gamma Ga_{1-\alpha-\gamma}N$ (0≦α≦0.2 and 0≦γ≦0.1) and layers of $Al_\beta In_\eta Ga_{1-\beta-\eta}N$ (0≦γ≦0.05 and 0≦η≦0.1).

* * * * *